US010074724B2

(12) United States Patent
Brewer et al.

(10) Patent No.: US 10,074,724 B2
(45) Date of Patent: *Sep. 11, 2018

(54) APPARATUS INCLUDING GETTERING AGENTS IN MEMORY CHARGE STORAGE STRUCTURES

(71) Applicant: MICRON TECHNOLOGY, INC., Boise, ID (US)

(72) Inventors: Rhett T. Brewer, Santa Clara, CA (US); Durai V. Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/351,977

(22) Filed: Nov. 15, 2016

(65) Prior Publication Data
US 2017/0062577 A1      Mar. 2, 2017

Related U.S. Application Data

(60) Continuation of application No. 14/822,272, filed on Aug. 10, 2015, now Pat. No. 9,515,151, which is a (Continued)

(51) Int. Cl.
*H01L 29/423* (2006.01)
*H01L 21/44* (2006.01)
(Continued)

(52) U.S. Cl.
CPC .... *H01L 29/42324* (2013.01); *G11C 14/0018* (2013.01); *G11C 16/0408* (2013.01);
(Continued)

(58) Field of Classification Search
None
See application file for complete search history.

(56) References Cited

U.S. PATENT DOCUMENTS 9,515,151 B2 * 12/2016 Brewer ............ H01L 21/28273
2005/0003212 A1    1/2005 Sun et al.
(Continued)

FOREIGN PATENT DOCUMENTS

| KR | 10-0816727 | 3/2008 |
| KR | 10-877100 | 1/2009 |
| WO | 2010098952 | 9/2010 |

OTHER PUBLICATIONS

Nirmal Ramaswamy; "Charge Storage Nodes With Conductive Nanodots"; U.S. Appl. No. 12/693,062, filed Jan. 25, 2010; Total pp. 25.

*Primary Examiner* — Daniel Whalen
(74) *Attorney, Agent, or Firm* — Dicke, Billig & Czaja, PLLC

(57) ABSTRACT

Apparatus having a processor and a memory device in communication with the processor, the memory device including an array of memory cells and a control logic to control access of the array of memory cells, wherein the array of memory cells includes a memory cell having a first dielectric adjacent a semiconductor, a control gate, a second dielectric between the control gate and the first dielectric, and a charge storage structure between the first dielectric and the second dielectric, and wherein the charge storage structure includes a charge-storage material and a gettering agent.

28 Claims, 9 Drawing Sheets

Related U.S. Application Data continuation of application No. 14/290,215, filed on May 29, 2014, now Pat. No. 9,105,665, which is a division of application No. 12/910,404, filed on Oct. 22, 2010, now Pat. No. 8,748,964.

(51) Int. Cl.

| | |
|---|---|
| H01L 21/28 | (2006.01) |
| H01L 27/11521 | (2017.01) |
| H01L 29/51 | (2006.01) |
| H01L 29/788 | (2006.01) |
| H01L 29/66 | (2006.01) |
| H01L 29/49 | (2006.01) |
| G11C 14/00 | (2006.01) |
| G11C 16/04 | (2006.01) |
| G11C 16/08 | (2006.01) |
| H01L 27/11524 | (2017.01) |
| H01L 21/24 | (2006.01) |
| H01L 21/265 | (2006.01) |

(52) U.S. Cl.
CPC ......... *G11C 16/0483* (2013.01); *G11C 16/08* (2013.01); *H01L 21/28273* (2013.01); *H01L 21/44* (2013.01); *H01L 27/11521* (2013.01); *H01L 27/11524* (2013.01); *H01L 29/42332* (2013.01); *H01L 29/4916* (2013.01); *H01L 29/511* (2013.01); *H01L 29/66825* (2013.01); *H01L 29/66833* (2013.01); *H01L 29/788* (2013.01); *H01L 29/7881* (2013.01); *H01L 21/244* (2013.01); *H01L 21/265* (2013.01)

(56) References Cited

U.S. PATENT DOCUMENTS

| | | | |
|---|---|---|---|
| 2007/0215924 A1* | 9/2007 | Nishikawa | H01L 21/28273 257/296 |
| 2009/0003065 A1* | 1/2009 | Mihnea | H01L 21/28273 365/185.11 |
| 2009/0008702 A1 | 1/2009 | Ramaswamy | |
| 2009/0067256 A1* | 3/2009 | Bhattacharyya | H01L 21/28273 365/185.28 |

\* cited by examiner

APPARATUS INCLUDING GETTERING AGENTS IN MEMORY CHARGE STORAGE STRUCTURES

RELATED APPLICATIONS

This is a continuation of U.S. application Ser. No. 14/822,272, titled "GETTERING AGENTS IN MEMORY CHARGE STORAGE STRUCTURES," filed Aug. 10, 2015, now U.S. Pat. No. 9,515,151, issued on Dec. 6, 2016, which is a continuation of U.S. application Ser. No. 14/290,215, titled "GETTERING AGENTS IN MEMORY CHARGE STORAGE STRUCTURES," filed May 29, 2014, now U.S. Pat. No. 9,105,665, issued Aug. 11, 2015, which is a divisional of U.S. application Ser. No. 12/910,404, titled "GETTERING AGENTS IN MEMORY CHARGE STORAGE STRUCTURES," filed Oct. 22, 2010, now U.S. Pat. No. 8,748,964, issued Jun. 10, 2014, which are commonly assigned and incorporated herein by reference in their entirety.

TECHNICAL FIELD

The present disclosure relates generally to semiconductor memories and, in particular, in one or more embodiments, the present disclosure relates to memory cells for non-volatile memory devices, the memory cells with charge storage structures having gettering agents incorporated therein.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

As memory densities increase, issues with data retention, program saturation and trap-up tend to worsen. For example, while polysilicon (sometimes referred to as polycrystalline silicon) charge storage structures have been commonly used for years, they tend to become impracticable as their thickness becomes too thin, e.g., around 60 Å (6 nm) or less. For the reasons stated above, and for other reasons stated below which will become apparent to those skilled in the art upon reading and understanding the present specification, there is a need in the art for alternative memory charge storage structures.

DETAILED DESCRIPTION

Figure 1:
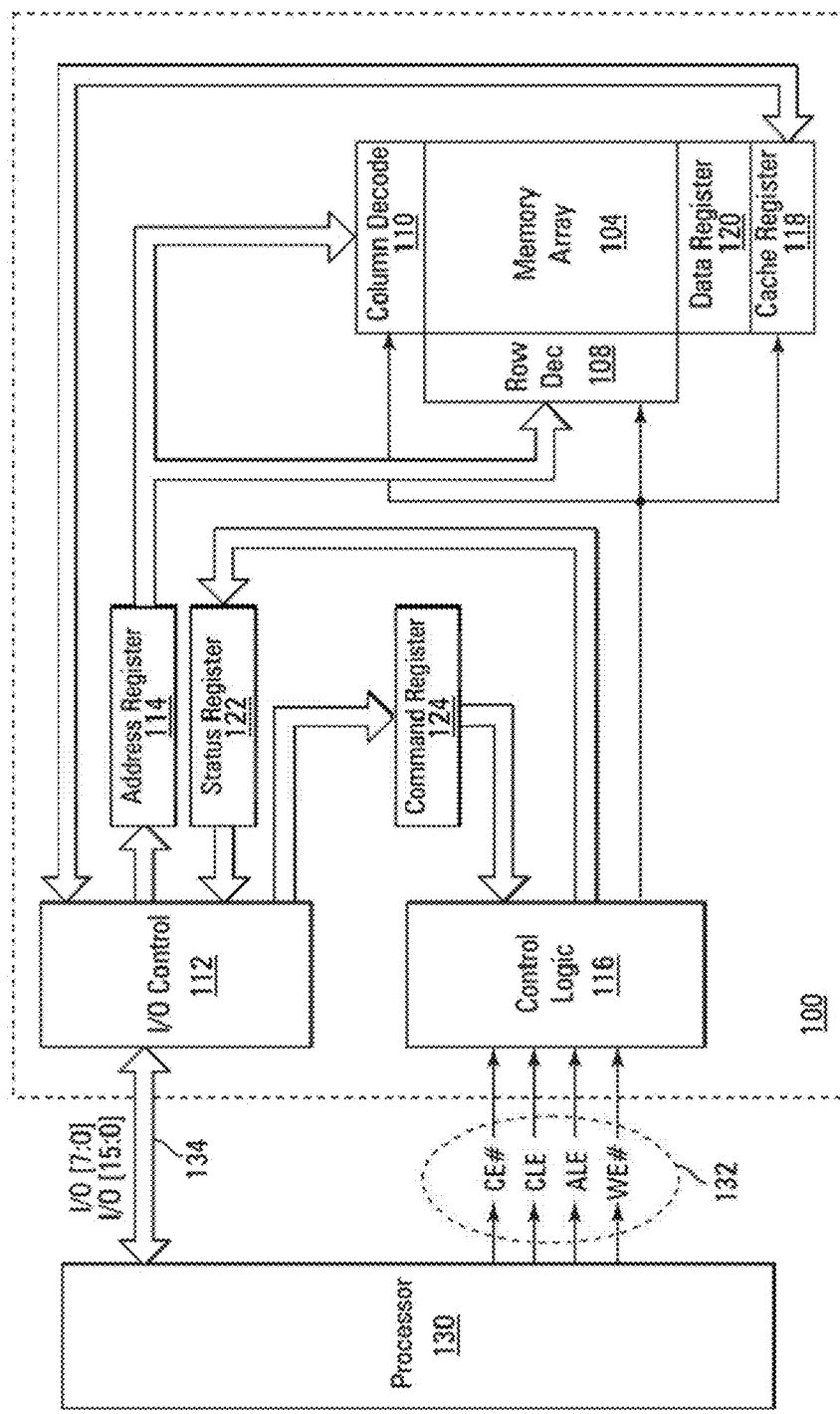
FIG. 1 is a simplified block diagram of a memory device coupled to a processor as part of an electronic system, according to an embodiment of the disclosure.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Traditional floating gate NAND flash structures often use a thick polysilicon (sometimes referred to as polycrystalline silicon) floating gate which can have the control gate wrapped around it, allowing it to program and erase with a silicon dioxide intergate dielectric on the polysilicon. However, this geometry may soon be impracticable to sustain in smaller devices because there may not be enough room to wrap the intergate dielectric and control gate around the polysilicon floating gate. Using this same materials stack in a planar geometry is generally unsatisfactory and may even fail to program. To address this issue, an intergate dielectric using a high-k dielectric may be required. These high-k dielectrics are primarily oxides, and depositing these oxides on polysilicon can oxidize the polysilicon, reducing its ability to function as a charge storage structure.

Various embodiments include memory cells having a charge storage structure between a first dielectric, e.g., a tunnel dielectric, and a second dielectric, e.g., an intergate dielectric, and memory devices and systems including such memory cells. Memory cells of this type are often referred to as floating-gate memory cells or charge trap memory cells. Charge storage structures of various embodiments include a charge-storage material and a gettering agent. As used herein, a gettering agent is an element or compound that is expected, in the case of unreacted oxygen, to preferentially react with that oxygen over the charge-storage material under the process conditions experienced by that charge-storage material; or that is expected, in the case of oxidized charge-storage material, to either pull the reacted oxygen away from the oxidized charge-storage material or to further react with the oxidized charge-storage material to produce a compound that is either conductive or is a dielectric compound having a higher k value than the oxidized charge-storage material. Some gettering agents may meet only one of these criteria, while others may meet more than one of these criteria. Such memory cells are useful in non-volatile memory devices.

Various embodiments use gettering agents to mitigate the oxidation risk of a charge-storage material of a charge storage structure. For example, metal doping and silicidation of a silicon-containing charge-storage material provides such gettering agents, e.g., metal silicides. For one or more embodiments, the metals incorporated into the charge-storage material thermodynamically react with $SiO_2$ to form either MSiOx (M=metal) or MOx+Si. For example, the elements used to getter oxygen from silicon may do so because their reaction products will have a lower Gibbs Free Energy than $SiO_2$, and high temperatures supplied during gate stack anneals, e.g., often over 900° C., may overcome the kinetic barriers that would prevent these reactions from occurring. Examples of metals that are theoretically known to work are zirconium (Zr), beryllium (Be), and magnesium (Mg). Additional metals which are expected to work are calcium (Ca), strontium (Sr), scandium (Sc), yttrium (Y), the rare earth metals (e.g. lanthanum (La)), thorium (Th), uranium (U), hafnium (Hf), and aluminum (Al). Beyond these theoretically functional metals, there is experimental evidence in the literature that other metals, such as titanium (Ti), will thermodynamically remove oxygen from silicon.

Such metals doped into a thin polysilicon floating gate could enable integration of the thin polysilicon floating gate with other oxide based materials by acting as an in situ getter for oxygen that is exposed to the polysilicon. As the oxygen reaches the polysilicon, it may either be preferentially bound to the doping metal, or if it does react with silicon to form $SiO_2$, later, during integration and high temperature anneals, a metal element may diffuse to the $SiO_2$ site, and pull the oxygen away from the Si to form MOx (metal oxide) or MSiOx (metal silicon oxide).

Having the oxygen bound to the metal accrues multiple benefits. Continuing the example of a polysilicon floating gate, one benefit is that it helps to ensure there is enough silicon to function as a charge storage structure. If too much of the silicon is oxidized, then the silicon may no longer function effectively as a floating gate. A second concern is that $SiO_2$ is a low-k dielectric which can add significant equivalent oxide thickness (EOT) to the gate stack. The voltage that is available to these gate stacks may be severely limited and this additional amount of EOT can cause additional amounts of voltage to be required to program and erase the charge storage structure and can make these devices unsuitable for memory products. Many of the described metals have oxides whose dielectric constants are high, e.g. $HfO_2$ has k=20 and $TiO_2$ has k=80. By converting the oxide from $SiO_2$, where k=3.9, to a high-k oxide, the EOT of the stack would be reduced.

One additional benefit of metal doping or silicidation of a polysilicon floating gate is that doping such thin polysilicon materials can be quite challenging. Additionally, even if such thin polysilicon materials were to be doped, the dopant species may diffuse out during thermal cycling. Metals described herein generally would not diffuse as easily and may still be available to ensure a sufficient number of electrons are available in the charge storage structure for proper program and erase functions.

Various embodiments incorporate into or on top of the charge-storage material a component that intrinsically scavenges oxygen while prior strategies relied on a barrier layer to prevent the charge-storage material from being exposed to an oxidant. The problem with such prior solutions is that layers of typical gate stacks will oxidize to some degree and such layers are generally permeable to oxygen at some level, increasing the risk that the charge-storage material will eventually become oxidized from available oxygen within the gate stack, thus degrading the cell stack EOT and degrading the electrical properties of the charge-storage material itself. By accepting the likely inevitability of oxygen reaching the charge-storage material, and by incorporating an element in the charge-storage material that will react with the oxygen and remove or inhibit the formation of undesirable oxidation products in situ, e.g., $SiO_2$ from a silicon-containing charge-storage material, improvements over prior solutions may be facilitated.

FIG. 1 is a simplified block diagram of a memory device 100, as one example of an integrated circuit device, in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be, for example, a memory controller or other external processor for use in the control and access of the memory device 100.

Memory device 100 includes an array of memory cells 104 logically arranged in rows and columns. At least one memory cell of the array of memory cells 104 includes a charge storage structure in accordance with an embodiment of the disclosure. Although various embodiments will be described primarily with reference to NAND memory arrays, the various embodiments are not limited to a specific architecture of the memory array 104. Some examples of other array architectures suitable for the present embodiments include NOR arrays, AND arrays or other arrays.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
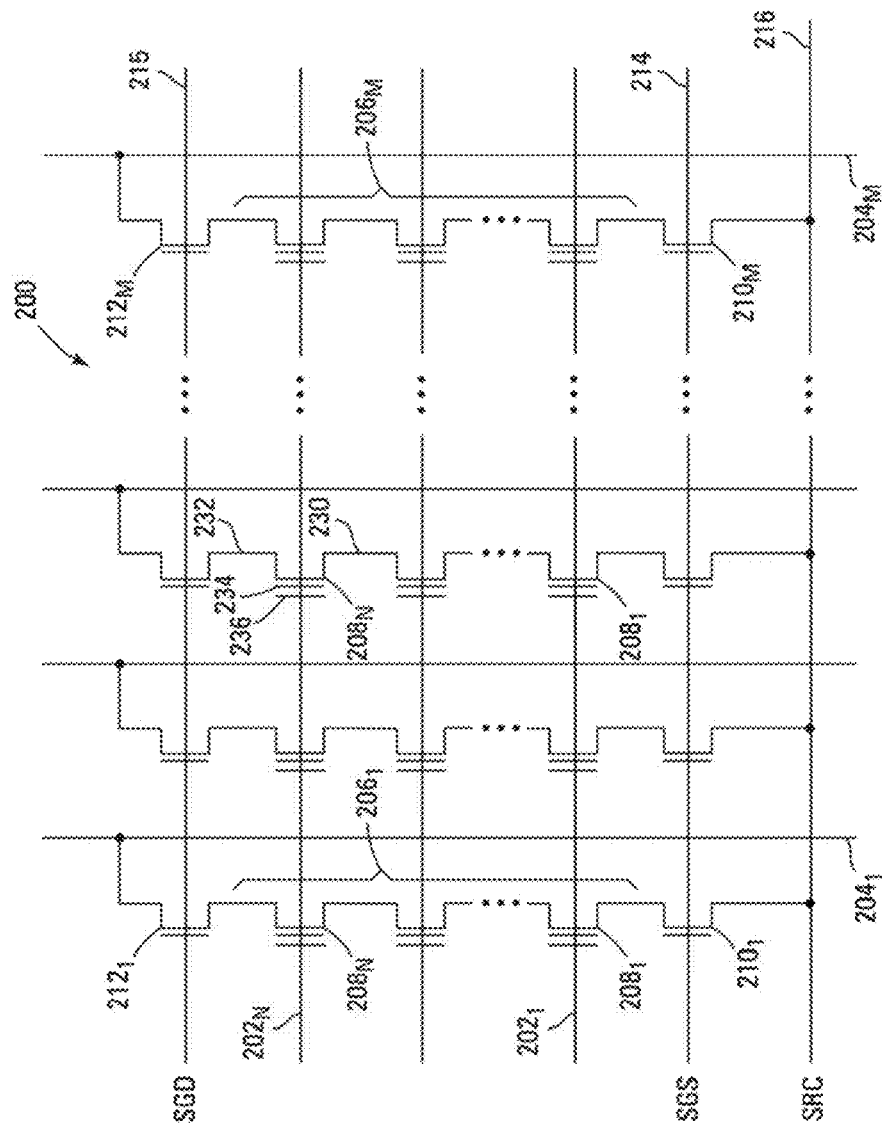
FIG. 2 is a schematic of a portion of an example NAND memory array as might be found in the memory device of FIG. 1.

FIG. 2 is a schematic of a NAND memory array 200, e.g., as a portion of memory array 104. Memory array 200 may be formed in a common conductively doped region (e.g., a common p-well) formed in a semiconductor.

As shown in FIG. 2, the memory array 200 includes access lines, commonly referred to as word lines (which may comprise commonly coupled control gates $202_1$ to $202_N$) and intersecting data lines, such as bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. At least one transistor 208 has a gate stack having a charge storage structure in accordance with an embodiment of the disclosure. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234 as a charge storage structure, and a control gate 236, as shown in FIG. 2. Floating-gate transistors 208 have their control gates 236 coupled to a word line 202 (e.g., the control gates may be commonly coupled to form a word line). A column of the floating-gate transistors 208 are those NAND strings 206 coupled to a given local bit line 204. A row of the floating-gate transistors 208 are those transistors commonly coupled to a given word line 202.

Figure 3A:
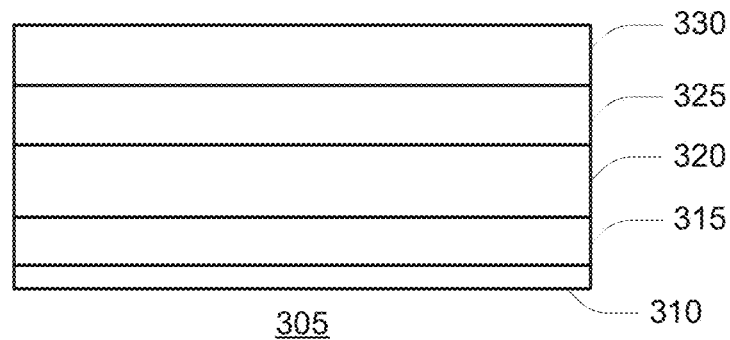
FIGS. 3A-3E depict a portion of a memory array during various stages of fabrication in accordance with an embodiment of the disclosure.

FIGS. 3A-3E depict a portion of a memory array during various stages of fabrication. FIG. 3A depicts a portion of a memory array after several processing steps have occurred. In general, FIG. 3A may depict a semiconductor 305 upon which portions of future gate stacks of non-volatile memory cells are formed. For one embodiment, the semiconductor 305 is a monocrystalline silicon. For a further embodiment, semiconductor 305 is a conductively-doped monocrystalline silicon. Other embodiments may include amorphous silicon, polysilicon or other semiconductor materials. Semiconductor 305 may be conductively doped to a first conductivity type, e.g., a p-type conductivity.

As further depicted in FIG. 3A, a tunnel dielectric 310, a charge storage structure 315 having one or more gettering agents in accordance with an embodiment of the disclosure, an intergate dielectric 320, a control gate 325 and a dielectric cap 330 have been formed on the semiconductor 305. These elements will form the gate stacks of future memory cells.

Formation of the structure of FIG. 3A can include formation of the tunnel dielectric 310 over an active region of the semiconductor 305, e.g., an area over which memory cells will be formed. For example, the active region of the semiconductor 305 may include a conductively-doped well of a semiconductor wafer. The tunnel dielectric 310 is generally one or more dielectric materials. The tunnel dielectric 310 might be formed, for example, by thermal oxidation of the semiconductor 305. Alternatively, the tunnel dielectric 310 could be formed by a blanket deposition of a dielectric material, such as by chemical vapor deposition (CVD), physical vapor deposition (PVD) or atomic layer deposition (ALD). Example dielectric materials for tunnel dielectric 310 include silicon oxides (SiOx), silicon nitride (SiNx), silicon oxynitrides (SiOxNy), aluminum oxides (AlOx), hafnium oxides (HfOx), hafnium aluminum oxides (HfAlOx), lanthanum oxides (LaOx), tantalum oxides (TaOx), zirconium oxides (ZrOx), zirconium aluminum oxides (ZrAlOx), etc., and combinations thereof.

The charge storage structure 315 is then formed over the tunnel dielectric 310. Formation of the charge storage structure 315 will be described in more detail with reference to FIGS. 4A-7B. The charge storage structure 315 can be used to store a charge indicative of a data state of the future memory cells. The charge storage structure 315 is a semiconductive to a conductive structure.

The intergate dielectric 320 is then formed over the charge storage structure 315. The intergate dielectric 320 is generally one or more dielectric materials. For example, the intergate dielectric 320 may include one or more layers of dielectric materials including high K dielectric materials. Example high-k dielectric materials for intergate dielectric 320 include aluminum oxides (AlOx), hafnium oxides (HfOx), hafnium aluminum oxides (HfAlOx), hafnium silicon oxides (HfSiOx), lanthanum oxides (LaOx), tantalum oxides (TaOx), zirconium oxides (ZrOx), zirconium aluminum oxides (ZrAlOx), yttrium oxide ($Y_2O_3$), etc. For one embodiment, the intergate dielectric 320 includes an ozone-based formation of hafnium silicon oxide followed by water-based formation of hafnium oxide. For a further embodiment, the intergate dielectric 320 includes a high-k dielectric material over silicon nitride.

The control gate 325 is formed over the intergate dielectric 320. In general, the control gate 325 includes one or more conductive materials. For one embodiment, the control gate 325 contains a conductively-doped polysilicon. For another embodiment, the control gate 325 contains a metal-containing material. For a further embodiment, the control gate 325 includes a metal-containing material over polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including, for example, titanium nitride, tantalum nitride, tantalum carbon nitride, tungsten nitride) for metal gates are generally recognized as refractory metal materials. For another embodiment, the control gate 325 contains multiple metal-containing materials, e.g., a titanium nitride (TiN) barrier over the intergate dielectric 320, titanium (Ti) as an adhesion material over the barrier, and tungsten (W) over the adhesion material.

The dielectric cap 330 can be formed over the control-gate 325 to act as an insulator and barrier layer to protect the control gate 325 during subsequent processing. The dielectric cap 330 contains one or more dielectric materials and may include, for example, such dielectrics as silicon oxides (SiOx), silicon nitride (SiNx), and silicon oxynitrides (SiOxNy). For one embodiment, the dielectric cap 330 is a silicon nitride, formed, for example, by such methods as CVD. It is noted that additional layers may be used to form the gate stack, such as barrier materials to inhibit diffusion between opposing materials or adhesion materials to promote adhesion between opposing materials.

Figure 3B:
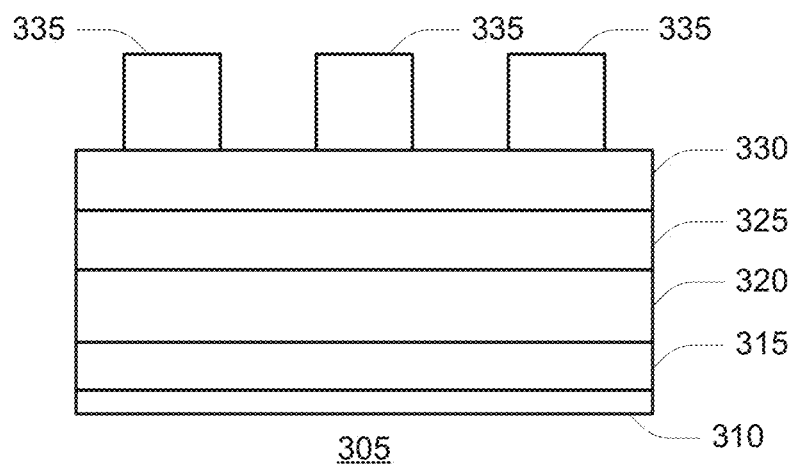

In FIG. 3B, a mask 335 is formed and patterned over the dielectric cap 330. As one example, a photolithographic resist material could be deposited overlying the dielectric cap 330, exposed to a radiation source, such as UV light, and developed to define areas overlying the dielectric cap 330 for removal.

Figure 3C:
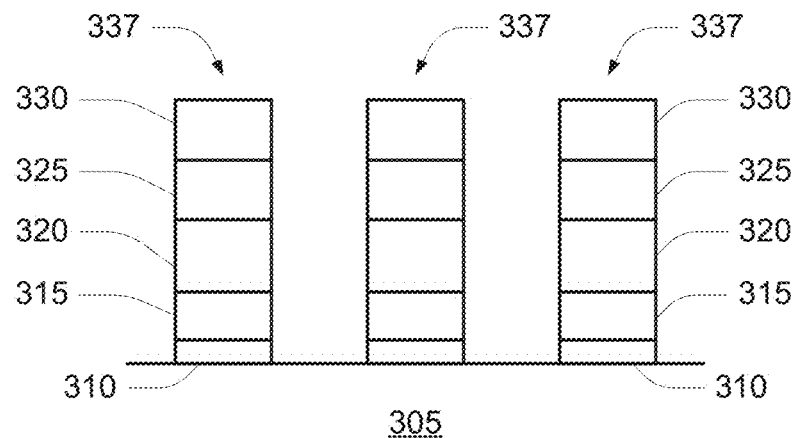

Following this patterning of the mask 335, exposed portions of the dielectric cap 330 and underlying portions are removed in FIG. 3C, such as by etching or other removal process, to expose the semiconductor 305. More than one removal process may be used where the chosen removal process is ineffective at removing an underlying material. Following removal, one or more gate stacks 337 for word lines are defined. Although FIGS. 3A-3E depict only memory cells, the select gates (not shown in FIGS. 3A-3E) may be formed of the same gate stacks 337.

Figure 3D:
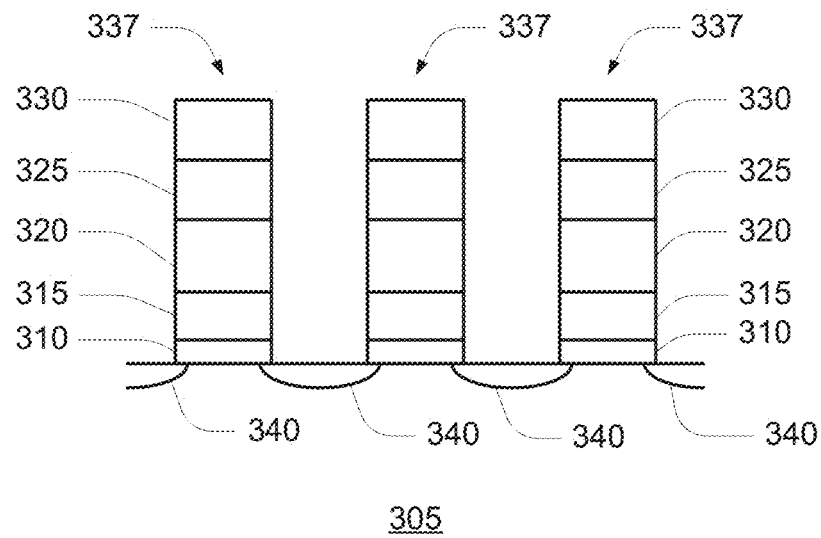

In FIG. 3D, source/drain regions 340 are formed generally adjacent the tunnel dielectric 310, such as by conductive doping of portions of the semiconductor 305 exposed in FIG. 3C. A channel region of a memory cell is defined by the area of the semiconductor 305 between the source/drain regions 340. Source/drain regions 340 will generally have a conductivity type different than the conductivity type of the semiconductor 305. The conductivity types may be opposites. For example, for a p-type semiconductor 305, the source/drain regions 340 might have an n+-type conductivity.

Figure 3E:
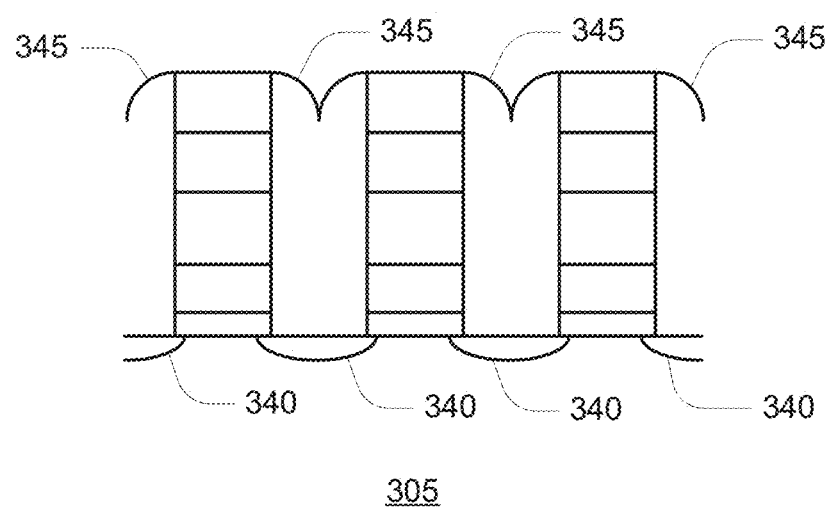

In FIG. 3E, dielectric spacers 345 may also be formed. As one example, a blanket deposit of some dielectric material, e.g., silicon nitride, is formed overlying the gate stacks 337, followed by an anisotropic removal of the blanket deposit to form the dielectric spacers 345. The resulting structure depicted in FIG. 3E includes series-coupled memory cells, such as those of a NAND string. However, it will be readily apparent that memory cells may be formed for an alternate array architecture using the gate stacks 337.

Figure 4A:
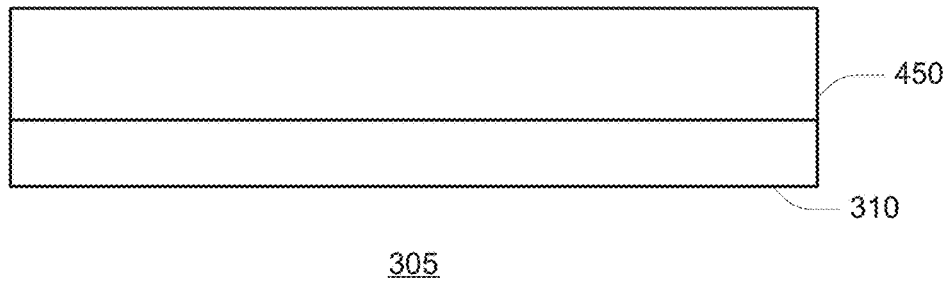
FIGS. 4A-4B depict a portion of a memory cell during various stages of fabrication of a charge storage structure in accordance with an embodiment of the disclosure.
Figure 4B:
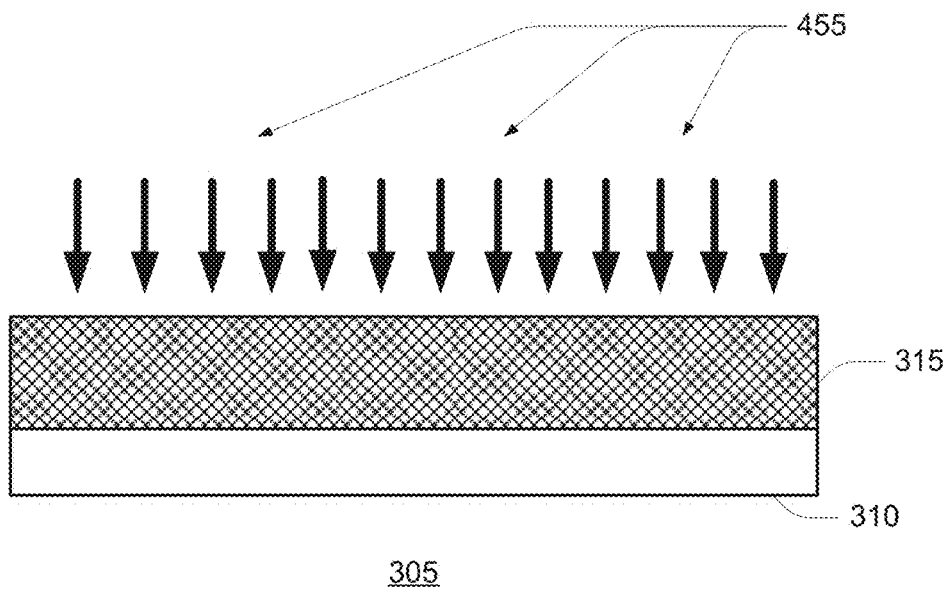

FIGS. 4A-4B depict a portion of a memory cell during various stages of fabrication of a charge storage structure 315 in accordance with an embodiment of the disclosure. In FIG. 4A, a charge-storage material 450 is formed over the tunnel dielectric 310 overlying the semiconductor 305. The charge-storage material 450 generally contains one or more materials capable of storing a charge. For at least some embodiments, the charge-storage material includes a silicon-containing material. Examples of silicon-containing charge-storage material include polysilicon, amorphous silicon and monocrystalline silicon. The charge-storage material 450 may be an undoped or conductively doped silicon-containing material. For example, the charge-storage material 450 might be a polysilicon material having a p-type conductivity. Conductively doping semiconductor materials, such as monocrystalline silicon, amorphous silicon and polysilicon, may be performed subsequent to formation or concurrent with formation.

For one embodiment, the charge-storage material 450 has a thickness of approximately 10 Å to 100 Å (1 nm to 10 nm). For a further embodiment, the charge-storage material 450 has a thickness of approximately 30 Å to 50 Å (3 nm to 5 nm). It is recognized that the variability of industrial fabrication will inherently produce minor variations in thickness such that a process seeking a particular thickness, e.g., 30 Å (3 nm), will likely produce thicknesses cell-to-cell that are above and below that particular value.

In FIG. 4B, one or more gettering agents, as represented by arrows 455, are incorporated into the charge-storage material 450 of the resulting charge storage structure 315. Various embodiments described herein will use the example of metals as the gettering agents 455 as certain of these are expected to be gettering agents for commonly used polysilicon floating gates. However, for charge-storage materials 450 other than silicon-containing materials, it will be understood that other elements or compounds may meet the gettering agent criteria described above. The metals 455 may be incorporated, for example, by ionic implantation, plasma, sputtering or other physical deposition process. Alternatively, the metals 455 may be incorporated into the charge-storage material 450 during formation of the charge-storage material 450, such as by chemical vapor deposition (CVD). Concentration of the metals may range, for example, from $1E19/cm^3$ to stoichiometric levels and above, and the metal concentration may be greater than 50 atomic percent (at %). Following incorporation of the metals 455, the device may be annealed to cause at least a portion of the metals 455 to react with the charge-storage material 450 to form the charge storage structure 315. For certain embodiments, the charge storage structure 315 consists essentially of silicon and one or more of a metal silicon oxide, a metal silicide, a metal oxide and a metal. For certain additional embodiments, the charge storage structure 315 consists essentially of a metal silicon oxide and one or more of a metal silicide, a metal oxide and a metal. For certain further embodiments, the charge storage structure 315 consists essentially of a metal silicide and one or more of a metal silicon oxide, a metal oxide and a metal. The anneal for various embodiments may be performed prior to the formation of a subsequent intergate dielectric 320, as a part of the processing for formation of the subsequent intergate dielectric 320, or after processing for formation of the subsequent intergate dielectric 320. At concentrations of metals 455 above the stoichiometric levels, layers or pockets of unreacted metals 455 may occur within the charge storage structure 315.

Figure 5A:
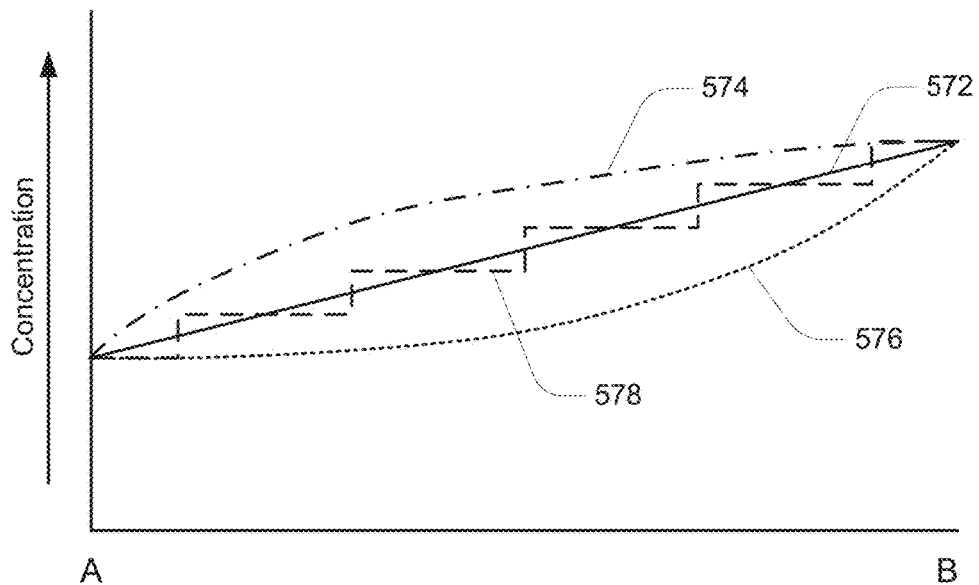
FIGS. 5A-5B shows conceptually concentration of metal across a charge-storage material in accordance with embodiments of the disclosure.
Figure 5B:
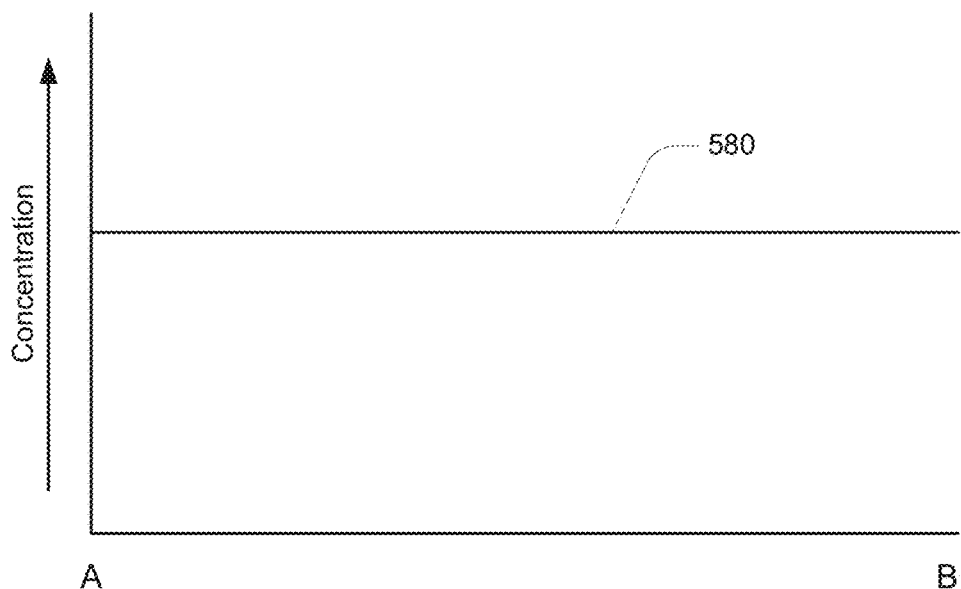

The concentration of the metals 455 may be a gradient across the charge-storage material 450, or it may be uniform across the charge-storage material 450. FIGS. 5A-5B show conceptually concentration of metal across a charge-storage material 450 from point A, corresponding to an interface between the charge-storage material 450 and the dielectric 310, to a point B, corresponding to an interface between the charge-storage material 450 and the intergate dielectric 320.

For various embodiments, the concentration of metals 455 is higher nearer point B. It is expected that oxidation risk is greater nearer this interface, and higher concentrations of metals 455 may be desirable nearer point B. The concentration of metals 455 may be a gradient, such as depicted in FIG. 5A. The gradient may be uniform as depicted by line 572, it may have a higher slope nearer point A than point B as depicted by line 574, it may have a higher slope nearer point B than point A as depicted by line 576, or it may be stepped as depicted by line 578. Alternatively, the concentration may be substantially uniform (e.g., uniform) from point A to point B as depicted by line 580. Other concentration curves will be apparent, such as concentrations curves having a lower concentration of metals 455 nearer point B, and the embodiments are not limited to a particular concentration curve.

Figure 6A:
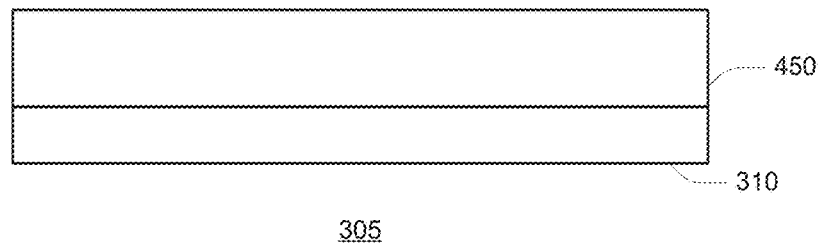
FIGS. 6A-6B depict a portion of a memory cell during various stages of fabrication of a charge storage structure in accordance with an embodiment of the disclosure.
Figure 6B:
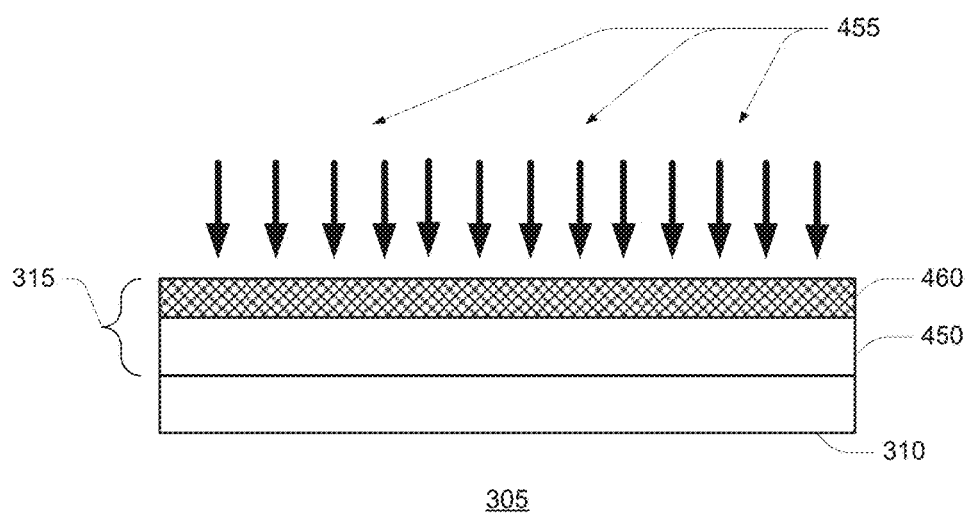

For certain embodiments, at least some of the charge-storage material 450 is formed to be substantially devoid (e.g., devoid) of metals 455. For example, polysilicon may be devoid of metals as formed. FIGS. 6A-6B depict a portion of a memory cell during various stages of fabrication of a charge storage structure 315 in accordance with an embodiment of the disclosure. In FIG. 6A, a charge-storage material 450 is formed over the tunnel dielectric 310 overlying the semiconductor 305. In FIG. 6B, metals 455 are incorporated into only a portion 460 of the charge-storage material 450. For example, in ionic implantation, plasma deposition or other physical deposition processes, implantation depth can generally be controlled by varying the amount of power applied. Alternatively, in a CVD process, during a first portion of formation, precursors for only the charge-storage material 450 could be supplied to the reaction until a particular thickness had been formed, then the reaction could continue by concurrently supplying precursors for the metals 455 with precursors for the charge-storage material 450. Alternatively, a barrier could be formed after forming the portion of charge-storage material 450 devoid of metals 455 and before forming the portion 460 of charge-storage material 450 having metals 455 incorporated therein. As with the embodiment of FIGS. 4A-4B, an anneal could be performed to react at least a portion of the metals 455 with the charge-storage material 450 of portion 460. For certain embodiments, the portion 460 consists essentially of silicon and one or more of a metal silicon oxide, a metal silicide, a metal oxide and a metal. For certain other embodiments, the portion 460 consists essentially of one or more of a metal silicon oxide, a metal silicide, and a metal. For additional embodiments, reaction products of portion 460 separate the remaining portion of charge-storage material 450 from the intergate dielectric 320. Formation of a memory cell using the charge storage structure 315 of FIG. 6B can proceed as described with reference to FIGS. 3A-3E.

Figure 7A:
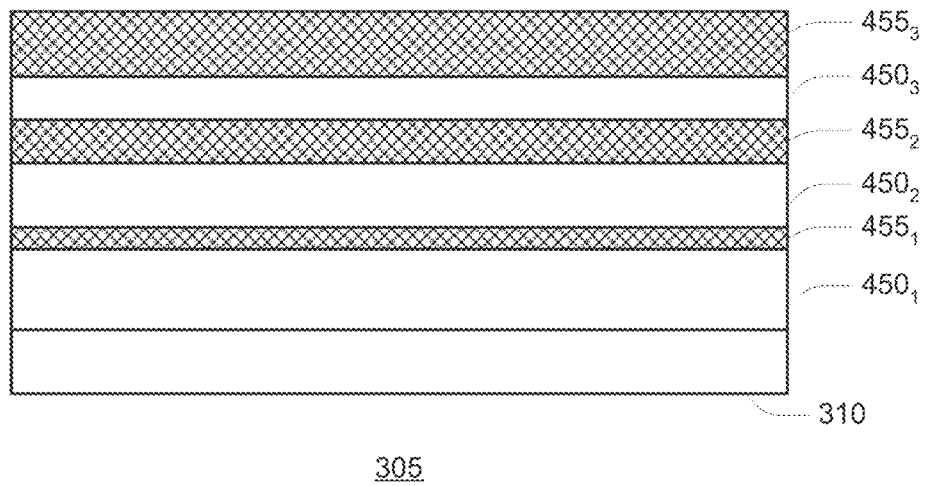
FIGS. 7A-7B depict a portion of a memory cell during various stages of fabrication of a charge storage structure in accordance with an embodiment of the disclosure.
Figure 7B:
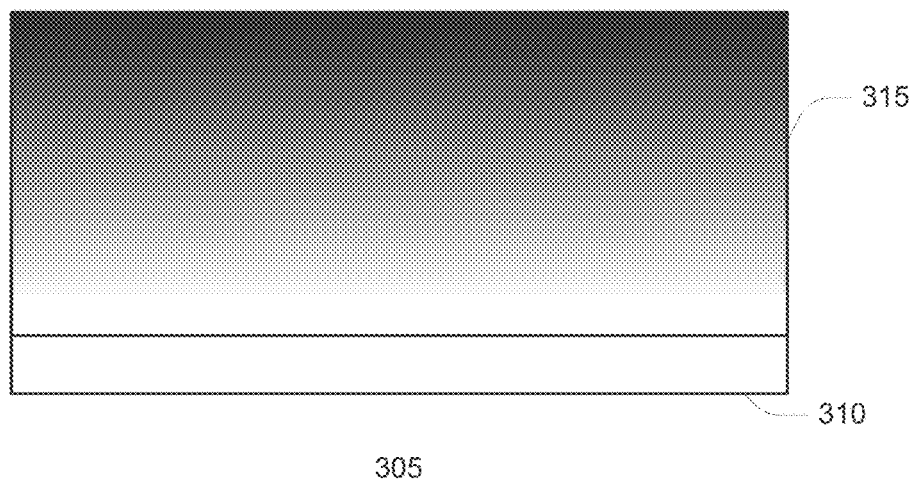

FIGS. 7A-7B depict a portion of a memory cell during various stages of fabrication of a charge storage structure 315 in accordance with an embodiment of the disclosure. The example of FIGS. 7A-7B show how metals 455 could be incorporated into the charge-storage material 450 in a sequential process. In FIG. 7A, a first charge-storage material 4501 is formed over the tunnel dielectric 310 overlying the semiconductor 305 and a first metal 4551 is formed over the first charge-storage material 4501. Subsequently, a second charge-storage material 4502 is formed over the first metal 4551 and a second metal 4552 is formed over the second charge-storage material 4502. Subsequently, a third charge-storage material 4503 is formed over the second metal 4552 and a third metal 4553 is formed over the third charge-storage material 4503. Fewer or additional layers may be formed in this manner.

In the example depicted in FIG. 7A, each successive formation of charge-storage material 450 is thinner, while each successive formation of metals 455 is thicker. Upon reacting at least a portion of the metals 455 with the charge-storage material 450 in this example, a gradient having a higher concentration nearer the top, i.e., nearer the intergate dielectric 320, will result, such as depicted in FIG. 7B. It is noted that similar results could be obtained by forming various layers of charge-storage material 450 having uniform thickness while increasing the thickness of subsequent layers of metals 455, or by forming various layers of metals 455 having uniform thickness while decreasing the thickness of subsequent layers of charge-storage material 450. If the ratio of metals 455 to charge-storage materials 450 is greater than a stoichiometric amount, layers of unreacted metals 455 may occur. Similarly, if the ratio of metals 455 to charge-storage materials 450 is less than a stoichiometric amount, layers of unreacted charge-storage material 450 may occur. For some embodiments, reaction products of the metals 455 separate any remaining charge-storage material 450 from the intergate dielectric 320, i.e., no portion of charge-storage material 450 is in contact with intergate dielectric 320. Formation of a memory cell using the charge storage structure 315 of FIG. 7B can proceed as described with reference to FIGS. 3A-3E. It will be apparent that the process depicted in FIG. 7A could be used to form portion 460 of the embodiment depicted in FIG. 6B.

CONCLUSION

Memory cells including a charge storage structure having one or more gettering agents can be useful in non-volatile memory devices. Various embodiments provide for gettering of oxygen from a charge-storage material of the charge storage structure to facilitate a mitigation of detrimental oxidation of the charge-storage material.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
a processor; and
a memory device in communication with the processor, the memory device comprising:
an array of memory cells; and
a control logic to control access of the array of memory cells, wherein the array of memory cells comprises a memory cell comprising:
a first dielectric adjacent a semiconductor;
a control gate;
a second dielectric between the control gate and the first dielectric; and
a charge storage structure between the first dielectric and the second dielectric;
wherein the charge storage structure comprises a charge-storage material and a gettering agent; and
wherein at least a portion of the charge storage structure comprises a ratio of the gettering agent to the charge-storage material that is greater than a stoichiometric amount.

2. The apparatus of claim 1, wherein, in the memory cell, the charge-storage material is a silicon-containing material.

3. The apparatus of claim 1, wherein, in the memory cell, the gettering agent comprises a plurality of gettering agents.

4. The apparatus of claim 1, wherein, in the memory cell, the gettering agent comprises an element or compound meeting at least one criteria, under process conditions experienced by the charge-storage material, selected from a group consisting of preferentially reacting with unreacted oxygen over the charge-storage material, pulling reacted oxygen away from an oxidized charge-storage material, further reacting with oxidized charge-storage material to produce a compound that is conductive, and further reacting with oxidized charge-storage material to produce a dielectric compound that has a higher k value than the oxidized charge-storage material.

5. The apparatus of claim 1, wherein, in the memory cell, the gettering agent comprises a metal.

6. The apparatus of claim 5, wherein, in the memory cell, the metal is selected from a group consisting of zirconium, beryllium, magnesium, calcium, strontium, scandium, yttrium, rare earth metals, lanthanum, thorium, uranium, hafnium, aluminum and titanium.

7. The apparatus of claim 5, wherein, in the memory cell, the gettering agent comprises a silicide of the metal.

8. The apparatus of claim 1, wherein, in the memory cell, at least a portion of the gettering agent is incorporated into the charge-storage material.

9. The apparatus of claim 8, wherein, in the memory cell, the gettering agent is incorporated into only a portion of the charge-storage material.

10. The apparatus of claim 1, wherein, in the memory cell, a concentration of the gettering agent is greater nearer the second dielectric than a concentration of the gettering agent nearer the first dielectric.

11. The apparatus of claim 1, wherein, in the memory cell, the charge-storage material is devoid of the gettering agent in a portion nearer the first dielectric.

12. The apparatus of claim 1, wherein the memory device of the apparatus further comprises:
an address register for latching address signals received from the processor;
a command register for latching command signals received from the processor;
a row decode circuitry for decoding the address signals latched in the address register; and
a column decode circuitry for decoding the address signals latched in the address register;
wherein the control logic of the memory device is configured to control access of the array of memory cells in response to the command signals latched in the command register, and is further configured to control the row decode circuitry and the column decode circuitry in response to the address signals latched in the address register for access of the array of memory cells.

13. An apparatus, comprising:
a processor; and
a memory device in communication with the processor, the memory device comprising:
an array of memory cells; and
a control logic to control access of the array of memory cells, wherein the array of memory cells comprises a memory cell comprising:

a first dielectric adjacent a semiconductor;
a control gate;
a second dielectric between the control gate and the first dielectric; and
a charge storage structure between the first dielectric and the second dielectric;
wherein the charge storage structure comprises a silicon-containing material and a metal; and
wherein at least a portion of the charge storage structure comprises a ratio of the metal to the silicon-containing material that is greater than a stoichiometric amount.

14. The apparatus of claim 13, wherein the memory device of the apparatus further comprises:
an address register for storing an address received from the processor; and
a command register for storing a command received from the processor;
wherein the control logic of the memory device is configured to control access of the array of memory cells in response to the command stored in the command register and the address stored in the address register.

15. The apparatus of claim 13, wherein, in the memory cell, the charge storage structure comprises the silicon-containing material and one or more metals.

16. The apparatus of claim 15, wherein, in the memory cell, a concentration of the one or more metals is greater than or equal to $1E19/cm^3$.

17. The apparatus of claim 16, wherein, in the memory cell, the concentration of the one or more metals is greater than 50 atomic percent.

18. An apparatus, comprising:
a processor; and
a memory device in communication with the processor, the memory device comprising:
an array of memory cells; and
a control logic to control access of the array of memory cells, wherein the array of memory cells comprises a memory cell comprising:
a first dielectric adjacent a semiconductor;
a control gate;
a second dielectric between the control gate and the first dielectric; and
a charge storage structure between the first dielectric and the second dielectric;
wherein the charge storage structure comprises polysilicon and a metal silicide; and
wherein the charge storage structure further comprises an unreacted elemental metal incorporated therein.

19. The apparatus of claim 18, wherein, in the memory cell, no portion of the polysilicon is in contact with the second dielectric.

20. The apparatus of claim 18, wherein the memory device of the apparatus further comprises:
an input/output (I/O) control circuitry;
an I/O bus for communication of command signals, address signals and/or data signals from the processor to the I/O control circuitry; and
a control link between the processor and the control logic for communication of control signals from the processor to the control logic.

21. An apparatus, comprising:
a processor; and
a memory device in communication with the processor, the memory device comprising:
an array of memory cells; and
a control logic to control access of the array of memory cells, wherein the array of memory cells comprises a memory cell comprising:
a first dielectric adjacent a semiconductor;
a control gate;
a second dielectric between the control gate and the first dielectric; and
a charge storage structure between the first dielectric and the second dielectric;
wherein the charge storage structure consists essentially of metal silicon oxide and at least one component selected from a group consisting of a metal silicide, a metal oxide and an unreacted metal; and
wherein at least a portion of the at least one component is incorporated into the silicon-containing material.

22. An apparatus, comprising:
a processor; and
a memory device in communication with the processor, the memory device comprising:
an array of memory cells; and
a control logic to control access of the array of memory cells, wherein the array of memory cells comprises a memory cell comprising:
a first dielectric adjacent a semiconductor;
a control gate;
a second dielectric between the control gate and the first dielectric; and
a charge storage structure between the first dielectric and the second dielectric;
wherein the charge storage structure consists essentially of a metal silicide and at least one component selected from a group consisting of a metal silicon oxide, a metal oxide and an unreacted metal; and
wherein at least a portion of the at least one component is incorporated into the metal silicide.

23. An apparatus, comprising:
a processor; and
a memory device in communication with the processor, the memory device comprising:
an array of memory cells; and
a control logic to control access of the array of memory cells, wherein the array of memory cells comprises a memory cell comprising:
a first dielectric adjacent a semiconductor;
a control gate;
a second dielectric between the control gate and the first dielectric; and
a charge storage structure between the first dielectric and the second dielectric;
wherein the charge storage structure comprises a charge-storage material, a reaction product of a metal and the charge-storage material, and unreacted instances of the metal.

24. The apparatus of claim 23, wherein, in the memory cell, the charge storage structure further comprises:
a first instance of the charge-storage material;
a second instance of the charge-storage material between the first instance of the charge-storage material and the second dielectric;
a first instance of the reaction product of the metal and the charge-storage material between the first instance of the charge-storage material and the second instance of the charge-storage material;

a second instance of the reaction product of the metal and the charge-storage material between the second instance of the charge-storage material and the second dielectric;

a first unreacted instance of the metal between the first instance of the reaction product of the metal and the charge-storage material, and the second instance of the charge-storage material; and a second unreacted instance of the metal between the second instance of the reaction product of the metal and the charge-storage material, and the second dielectric.

25. The apparatus of claim 24, wherein, in the memory cell, the second instance of the charge-storage material is thinner than the first instance of the charge-storage material, and wherein the second unreacted instance of the metal is thicker than the first unreacted instance of the metal.

26. The apparatus of claim 24, wherein, in the memory cell, the second instance of the charge-storage material is thinner than the first instance of the charge-storage material, and wherein the second unreacted instance of the metal and the first unreacted instance of the metal are a same thickness.

27. The apparatus of claim 24, wherein, in the memory cell, the second instance of the charge-storage material and the first instance of the charge-storage material are a same thickness, and wherein the second unreacted instance of the metal is thicker than the first unreacted instance of the metal.

28. The apparatus of claim 24, wherein the memory device of the apparatus further comprises:

an address register for storing an address received from the processor; and a command register for storing a command received from the processor;

wherein the control logic of the memory device is configured to control access of the array of memory cells in response to the command stored in the command register and the address stored in the address register.

* * * * *

UNITED STATES PATENT AND TRADEMARK OFFICE
CERTIFICATE OF CORRECTION

PATENT NO. : 10,074,724 B2
APPLICATION NO. : 15/351977
DATED : September 11, 2018
INVENTOR(S) : Brewer et al.

Page 1 of 1

It is certified that error appears in the above-identified patent and that said Letters Patent is hereby corrected as shown below:

In the Claims

Column 14, Claim 21 Line 11, delete "of metal silicon" and insert in place thereof --of a metal silicon--.

Signed and Sealed this
Twelfth Day of February, 2019

Andrei Iancu
*Director of the United States Patent and Trademark Office*